(12) United States Patent
Kim et al.

(10) Patent No.: US 11,257,660 B2
(45) Date of Patent: Feb. 22, 2022

(54) APPARATUS AND METHOD FOR TREATING SUBSTRATE

(71) Applicant: Semes Co., Ltd, Cheonan-si (KR)

(72) Inventors: Daehyun Kim, Seoul (KR); Saewon Na, Cheongju-si (KR); Sun Joo Park, Seoul (KR)

(73) Assignee: Semes Co., Ltd., Chungcheongnam-do (KR)

(*) Notice: Subject to any disclaimer, the term of this patent is extended or adjusted under 35 U.S.C. 154(b) by 0 days.

(21) Appl. No.: 16/929,231

(22) Filed: Jul. 15, 2020

(65) Prior Publication Data

US 2021/0020412 A1    Jan. 21, 2021

(30) Foreign Application Priority Data

Jul. 16, 2019   (KR) .................. 10-2019-0085473

(51) Int. Cl.
*H01J 37/32* (2006.01)
*H01L 21/67* (2006.01)

(52) U.S. Cl.
CPC .... *H01J 37/32183* (2013.01); *H01J 37/3244* (2013.01); *H01L 21/67069* (2013.01); *H01J 2237/334* (2013.01)

(58) Field of Classification Search
CPC ............ H01J 37/3244; H01J 2237/334; H01L 21/6831; H01L 21/67103; H01L 27/67069; H01L 37/32183; H01L 21/67109
See application file for complete search history.

(56) References Cited

U.S. PATENT DOCUMENTS

| 4,679,007 A * | 7/1987 | Reese ............... H01J 37/32082 333/17.3 |
| 2004/0035365 A1* | 2/2004 | Yamazawa ............ H01J 37/321 118/723 E |
| 2010/0012029 A1* | 1/2010 | Forster .............. H01J 37/32165 118/708 |

FOREIGN PATENT DOCUMENTS

| JP | 2001-007086 A | 1/2001 |
| JP | 2001007086 A * | 1/2001 |

(Continued)

OTHER PUBLICATIONS

D. Eremin, "Electromagnetic Effects in Capacitively Coupled Plasmas", Institute for Theoretical Electrical Engineering, Ruhr University Bochum, Center for Plasma Science and Technology, D-44780 Bochum, Germany, Dated Oct. 13, 2015.

(Continued)

*Primary Examiner* — Yuechuan Yu
(74) *Attorney, Agent, or Firm* — Harness, Dickey & Pierce, P.L.C.

(57) ABSTRACT

An apparatus for treating a substrate includes a process chamber having a treatment space therein, a support unit that supports the substrate in the treatment space, a gas supply unit that supplies a process gas into the treatment space, an RF power supply that supplies an RF signal to excite the process gas into plasma, and a matching circuit connected between the RF power supply and the process chamber. The matching circuit includes an impedance matching device that performs impedance matching and a harmonic removal device that removes harmonics caused by the RF power supply. The matching circuit operates in a first mode when the harmonics caused by the RF power supply are sensed and in a second mode when the harmonics caused by the RF power supply are not sensed.

16 Claims, 9 Drawing Sheets

(56) References Cited

FOREIGN PATENT DOCUMENTS

| | | |
|---|---|---|
| JP | 2006-324725 A | 11/2006 |
| JP | 2017-099037 A | 6/2017 |
| KR | 10-2002-0027310 A | 4/2002 |
| KR | 10-2004-0060199 A | 7/2004 |
| KR | 10-2004-0064732 A | 7/2004 |
| KR | 10-2008-0071492 A | 8/2008 |
| KR | 10-2013-0058837 A | 6/2013 |

OTHER PUBLICATIONS

Sawada et al, "Relationship between center-peaked plasma density profiles and harmonic electromagnetic waves in very high frequency capacitively coupled plasma reactors", Japanese Journal of Applied Physics, 2014.
Office Action for Korean Application No. 10-2019-0085473 dated May 20, 2020.

* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2019-0085473 filed on Jul. 16, 2019, in the Korean Intellectual Property Office, the entire contents of which are hereby incorporated by reference.

BACKGROUND

Embodiments of the inventive concept described herein relate to an apparatus and method for treating a substrate, and more particularly, relate to a substrate treating apparatus and method for removing harmonics generated in a substrate treating process.

To manufacture semiconductor elements, desired patterns are formed on a substrate by performing various processes such as photolithography, etching, ashing, ion implantation, thin-film deposition, cleaning, and the like. Among these processes, the etching process is a process of removing a selected region of a film formed on the substrate. The etching process is classified into a wet etching process and a dry etching process. An etching apparatus using plasma is used for the dry etching process.

In general, to generate plasma, an electromagnetic field is formed in the interior space of a process chamber. The electromagnetic field excites a process gas in the process chamber into plasma. The plasma refers to an ionized gaseous state of matter containing ions, electrons, and radicals. The plasma is generated by very high temperature, a strong electric field, or an RF electromagnetic field.

In a capacitively coupled plasma processing apparatus using RF power, an upper electrode and a lower electrode are disposed in a processing vessel so as to be parallel to each other, a substrate (e.g., a semiconductor wafer or a glass substrate) to be processed is mounted on the lower electrode, and RF power with a frequency (usually, 13.56 MHz or more) appropriate for generation of plasma is applied to the upper electrode or the lower electrode. Due to the application of the RF power, electrons are accelerated by an RF electric field generated between the two electrodes opposite each other, and plasma is generated by ionization by collision of the electrons with a process gas. By a gas-phase reaction or surface reaction of radicals or ions contained in the plasma, a thin film is deposited on the substrate, or a material or a thin film on the surface of the substrate is etched. To improve processing quality of the substrate, the plasma needs to be uniformly generated in the process chamber.

In the substrate processing apparatus in the related art, due to a center-peak phenomenon that occurs when RF power with a frequency of 100 MHz or more is applied, there is an imbalance in electron density between a central portion and an edge portion of the apparatus, and the electron density imbalance causes an imbalance in plasma density. According to the following prior art document, the center-peak phenomenon is related to harmonics with a frequency of 100 MHz or more. Accordingly, interruption and control of the harmonics with a frequency of 100 MHz or more are required.

PRIOR ART DOCUMENT

Non-Patent Document

Relationship between center-peaked plasma density profiles and harmonic electromagnetic waves in very high frequency capacitively coupled plasma reactors, Ikuo Sawadal, Mar. 5, 2014

SUMMARY

Embodiments of the inventive concept provide a substrate treating apparatus and method for removing harmonics generated when RF power is applied.

The technical problems to be solved by the inventive concept are not limited to the aforementioned problems, and any other technical problems not mentioned herein will be clearly understood from this specification and the accompanying drawings by those skilled in the art to which the inventive concept pertains.

According to an exemplary embodiment, an apparatus for treating a substrate includes a process chamber having a treatment space therein, a support unit that supports the substrate in the treatment space, a gas supply unit that supplies a process gas into the treatment space, an RF power supply that supplies an RF signal to excite the process gas into plasma, and a matching circuit connected between the RF power supply and the process chamber. The matching circuit includes an impedance matching device that performs impedance matching and a harmonic removal device that removes harmonics caused by the RF power supply.

The matching circuit may operate in a first mode when the harmonics caused by the RF power supply are sensed and may operate in a second mode when the harmonics caused by the RF power supply are not sensed.

A transition to the first mode or the second mode may be performed by switching switches connected to opposite ends of the harmonic removal device included in the matching circuit.

The harmonic removal device may include a harmonic removal line including a first variable capacitor that removes the harmonics and a bypass line connected with the harmonic removal line in parallel.

The harmonic removal device may further include a first switch that switches between one end of the bypass line and one end of the harmonic removal line and a second switch that switches between an opposite end of the bypass line and an opposite end of the harmonic removal line.

A transition to the first mode or the second mode may be performed by selective connection of the first switch and the second switch.

The matching circuit may further include a sensor that senses the harmonics caused by the RF power supply.

The matching circuit may remove the harmonics by adjusting the first variable capacitor included in the harmonic removal device.

According to an exemplary embodiment, an apparatus for treating a substrate includes a process chamber having a treatment space therein, a support unit that supports the substrate in the treatment space, a gas supply unit that supplies a process gas into the treatment space, an RF power supply that supplies an RF signal to excite the process gas into plasma, and a matching circuit connected between the RF power supply and the process chamber. The matching circuit includes an impedance matching device that performs impedance matching, a harmonic removal device that removes harmonics caused by the RF power supply, and an impedance controller that removes harmonics caused by non-linearity of the plasma in the chamber.

The matching circuit may operate in a first mode when the harmonics caused by the RF power supply or the harmonics caused by the non-linearity of the plasma in the chamber are sensed, and may operate in a second mode when the harmonics caused by the RF power supply or the harmonics caused by the non-linearity of the plasma in the chamber are not sensed.

A transition to the first mode or the second mode may be performed by switching switches connected to opposite ends of the harmonic removal device included in the matching circuit and a switch included in the impedance controller.

The harmonic removal device may include a harmonic removal line including a first variable capacitor that removes the harmonics and a bypass line connected with the harmonic removal line in parallel, and the impedance controller may include a high-pass filter and a second variable capacitor connected with the high-pass filter in series.

The harmonic removal device may further include a first switch that switches between one end of the bypass line and one end of the harmonic removal line and a second switch that switches between an opposite end of the bypass line and an opposite end of the harmonic removal line, and the impedance controller may further include a third switch connected to one end of the high-pass filter.

A transition to the first mode or the second mode may be performed by selective connection of the first switch, the second switch, and the third switch.

The matching circuit may remove the harmonics by adjusting the first variable capacitor included in the harmonic removal device and the second variable capacitor included in the impedance controller.

According to an exemplary embodiment, a method for treating a substrate in a substrate treating apparatus that is connected with an RF power supply and that generates plasma in a process chamber includes determining whether harmonics caused by the RF power supply are generated, determining whether harmonics caused by the plasma are generated, operating in a first mode when it is determined that the harmonics are generated, and operating in a second mode when it is determined that the harmonics are not generated.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Other advantages and features of the inventive concept, and implementation methods thereof will be clarified through the following embodiments to be described in detail with reference to the accompanying drawings. The inventive concept may, however, be embodied in different forms and should not be construed as being limited to the embodiments set forth herein. Rather, these embodiments are provided so that the inventive concept is thorough and complete and fully conveys the scope of the inventive concept to a person skilled in the art to which the inventive concept pertains. Further, the inventive concept is only defined by the appended claims.

Even though not defined, all terms used herein (including technical or scientific terms) have the same meanings as those generally accepted by general technologies in the related art to which the inventive concept pertains. The terms defined in general dictionaries may be construed as having the same meanings as those used in the related art and/or a text of the present application and even when some terms are not clearly defined, they should not be construed as being conceptual or excessively formal.

Terms used herein are only for description of embodiments and are not intended to limit the inventive concept. As used herein, the singular forms are intended to include the plural forms as well, unless context clearly indicates otherwise. It will be further understood that the terms "comprise" and/or "comprising" used herein specify the presence of stated features or components, but do not preclude the presence or addition of one or more other features or components. In the specification, the term "and/or" indicates each of listed components or various combinations thereof.

Figure 1:
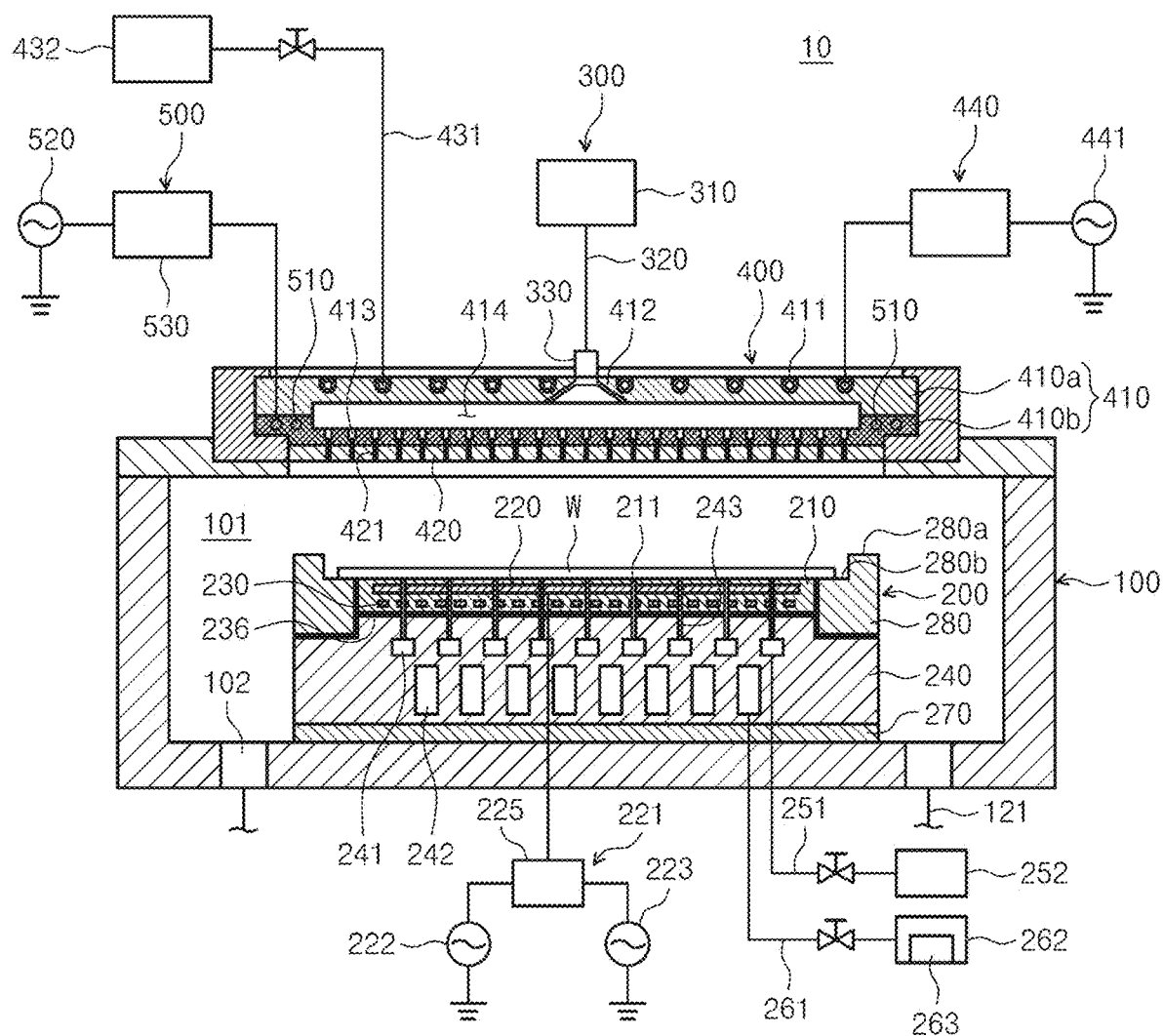
FIG. 1 is an exemplary view illustrating a substrate treating apparatus according to an embodiment of the inventive concept.

FIG. 1 is an exemplary view illustrating a substrate treating apparatus 10 according to an embodiment of the inventive concept.

Referring to FIG. 1, the substrate treating apparatus 10 treats a substrate W using plasma. For example, the substrate treating apparatus 10 may perform an etching process on the substrate W. The substrate treating apparatus 10 includes a chamber 100, a substrate support assembly 200, a gas supply unit 300, a plasma generation unit 400, and a heating unit 500.

The chamber 100 has an interior space 101 formed therein. The interior space 101 is provided as a space in which plasma processing is performed on a substrate W. The plasma processing on the substrate W includes an etching process. The chamber 100 has an exhaust hole 102 formed in the bottom thereof. The exhaust hole 102 is connected with an exhaust line 121. Reaction byproducts generated in the process and gases staying in the chamber 100 may be released to the outside through the exhaust line 121. The pressure in the interior space 101 of the chamber 100 is reduced to a predetermined pressure by the exhaust process.

The substrate support assembly 200 is located in the chamber 100. The substrate support assembly 200 supports the substrate W. The substrate support assembly 200 includes an electrostatic chuck that clamps the substrate W using an electrostatic force. The substrate support assembly 200 includes a dielectric plate 210, a lower electrode 220, a heater 230, a support plate 240, and an insulating plate 270.

The dielectric plate 210 is located at the top of the substrate support assembly 200. The dielectric plate 210 is formed of a dielectric substance in a circular plate shape. The substrate W is placed on an upper surface of the dielectric plate 210. The upper surface of the dielectric plate 210 has a smaller radius than the substrate W. Due to this, an edge region of the substrate W is located outside the dielectric plate 210. The dielectric plate 210 has a first supply passage 211 formed therein. The first supply passage 211 extends from the upper surface of the dielectric plate 210 to a lower surface thereof. A plurality of first supply passages 211 are formed to be spaced apart from each other. The first supply passages 211 serve as passages through which a heat transfer medium is supplied to a lower surface of the substrate W. The dielectric plate 210 may have a separate electrode embedded therein for clamping the substrate W to the dielectric plate 210. DC current may be applied to the electrode. An electrostatic force may act between the electrode and the substrate W due to the applied current, and the substrate W may be clamped to the dielectric plate 210 by the electrostatic force.

The lower electrode 220 is connected with a lower power supply 221. The lower power supply 221 applies power to the lower electrode 220. The lower power supply 221 includes lower RF power supplies 222 and 223 and a lower impedance matcher 225. A plurality of lower RF power supplies 222 and 223 may be provided as illustrated in FIG. 1, or selectively, only one lower RF power supply may be provided. The lower RF power supplies 222 and 223 may adjust plasma density. The lower RF power supplies 222 and 223 mainly adjust ion bombardment energy. The lower RF power supplies 222 and 223 may generate power with a frequency of 2 MHz and power with a frequency of 13.56 Hz, respectively. The lower impedance matcher 225 is electrically connected with the lower RF power supplies 222 and 223 and matches and applies the powers with the different frequencies to the lower electrode 220.

The heater 230 is electrically connected with an external power supply (not illustrated). The heater 230 generates heat by resisting current applied from the external power supply. The generated heat is transferred to the substrate W through the dielectric plate 210. The substrate W is maintained at a predetermined temperature by the heat generated from the heater 230. The heater 230 includes a spiral coil. The heater 230 may be embedded in the dielectric plate 210 at equal intervals.

The support plate 240 is located under the dielectric plate 210. The lower surface of the dielectric plate 210 and an upper surface of the support plate 240 may be bonded by an adhesive 236. The support plate 240 may be formed of an aluminum material. The upper surface of the support plate 240 may have a step such that a central region is located in a higher position than an edge region. The central region of the upper surface of the support plate 240 has an area corresponding to the lower surface of the dielectric plate 210 and is bonded to the lower surface of the dielectric plate 210.

The support plate 240 has a first circulation passage 241, a second circulation passage 242, and second supply passages 243 formed therein.

The first circulation passage 241 serves as a passage through which the heat transfer medium circulates. The first circulation passage 241 may be formed in a spiral shape in the support plate 240. Alternatively, the first circulation passage 241 may be implemented with ring-shaped passages that have different radii and that are concentric with one another. The first circulation passages 241 may be connected together. The first circulation passages 241 are formed at the same height.

The second circulation passage 242 serves as a passage through which a cooling fluid circulates. The second circulation passage 242 may be formed in a spiral shape in the support plate 240. Alternatively, the second circulation passage 242 may be implemented with ring-shaped passages that have different radii and that are concentric with one another. The second circulation passages 242 may be connected together. The second circulation passages 242 may have a larger cross-sectional area than the first circulation passages 241. The second circulation passages 242 are formed at the same height. The second circulation passages 242 may be located under the first circulation passages 241.

The second supply passages 243 extend upward from the first circulation passages 241 to the upper surface of the support plate 240. As many second supply passages 243 as the first supply passages 211 are provided. The second supply passages 243 connect the first circulation passages 241 and the first supply passages 211.

The first circulation passages 241 are connected with a heat transfer medium reservoir 252 through a heat transfer medium supply line 251. The heat transfer medium is stored in the heat transfer medium reservoir 252. The heat transfer medium includes an inert gas. According to an embodiment, the heat transfer medium includes a helium (He) gas. The helium gas is supplied to the first circulation passages 241 through the heat transfer medium supply line 251. Thereafter, the helium gas sequentially passes through the second supply passages 243 and the first supply passages 221 and is supplied to the lower surface of the substrate W. The helium gas serves as a medium through which heat transferred from plasma to the substrate W is transferred to the substrate support assembly 200. Ion particles contained in plasma are attracted and moved to the substrate support assembly 200 by an electric force formed in the substrate support assembly 200 and collide with the substrate W to perform an etching process in the process of moving to the substrate support assembly 200. In the process in which the ion particles collide with the substrate W, heat is generated from the substrate W. The heat generated from the substrate W is transferred to the substrate support assembly 200 through the helium gas supplied into the space between the lower surface of the substrate W and the upper surface of the dielectric plate 210. Accordingly, the substrate W may be maintained at a set temperature.

The second circulation passages 242 are connected with a cooling fluid reservoir 262 through a cooling fluid supply line 261. The cooling fluid is stored in the cooling fluid reservoir 262. A cooler 263 may be provided in the cooling fluid reservoir 262. The cooler 263 cools the cooling fluid to a predetermined temperature. Alternatively, the cooler 263 may be installed on the cooling fluid supply line 261. The cooling fluid supplied to the second circulation passages 242 through the cooling fluid supply line 261 cools the support plate 240 while circulating along the second circulation passages 242. The support plate 240, while being cooled, cools the dielectric plate 210 and the substrate W together to maintain the substrate W at the predetermined temperature.

The insulating plate 270 is provided under the support plate 240. The insulating plate 270 has a size corresponding to that of the support plate 240. The insulating plate 270 is located between the support plate 240 and the bottom of the chamber 100. The insulating plate 270 is formed of an insulating material and electrically insulates the support plate 240 and the chamber 100.

A focus ring 280 is disposed on an edge region of the substrate support assembly 200. The focus ring 200 has a ring shape and is disposed around the dielectric plate 210. An upper surface of the focus ring 280 may have a step such that an outer portion 280a is located in a higher position than an inner portion 280b. The inner portion 280b of the upper surface of the focus ring 280 is located at the same height as the upper surface of the dielectric plate 210. The inner portion 280b of the upper surface of the focus ring 280 supports the edge region of the substrate W that is located outside the dielectric plate 210. The outer portion 280a of the focus ring 280 surrounds the edge region of the substrate W. To locate the substrate W at the center of an area in which plasma is formed, the focus ring 280 expands an area in which an electric field is formed. Accordingly, plasma may be uniformly formed over the entire region of the substrate W, and thus each region of the substrate W may be uniformly etched.

The gas supply unit 300 supplies a process gas into the chamber 100. The gas supply unit 300 includes a gas reservoir 310, a gas supply line 320, and a gas intake port 330. The gas supply line 320 connects the gas reservoir 310 and the gas intake port 330 and supplies the process gas stored in the gas reservoir 310 to the gas intake port 330. The gas intake port 330 is connected with gas supply holes 412 formed in an upper electrode 410.

The plasma generation unit 400 excites the process gas staying in the chamber 100. The plasma generation unit 400 includes the upper electrode 410, a distribution plate 420, and an upper power supply 440.

The upper electrode 410 has a circular plate shape and is located over the substrate support assembly 200. The upper electrode 410 includes an upper plate 410a and a lower plate 410b. The upper plate 410a has a circular plate shape. The upper plate 410a is electrically connected with an upper RF power supply 441. The upper plate 410a excites the process gas staying in the chamber 100 by applying, to the process gas, first RF power generated from the upper RF power supply 441. The process gas is excited into plasma. A lower surface of the upper plate 410a has a step such that a central region is in a higher position than an edge region. The upper plate 410a has the gas supply holes 412 formed in the central region thereof. The gas supply holes 412 are connected with the gas intake port 330 and supply the process gas into a buffer space 414. The upper plate 410a may have a cooling fluid channel 411 formed therein. The cooling fluid channel 411 may be formed in a spiral shape. Alternatively, the cooling fluid channel 411 may be implemented with ring-shaped cooling fluid channels that have different radii and that are concentric with one another. The cooling fluid channel 411 is connected with a cooling fluid reservoir 432 through a cooling fluid supply line 431. The cooling fluid reservoir 432 stores a cooling fluid. The cooling fluid stored in the cooling fluid reservoir 431 is supplied to the cooling fluid channel 411 through the cooling fluid supply line 431. The cooling fluid cools the upper plate 410a while circulating through the cooling fluid channel 411.

The lower plate 410b is located under the upper plate 410a. The lower plate 410b has a size corresponding to that of the upper plate 410a and is located to face the upper plate 410a. An upper surface of the lower plate 410b has a step such that a central region is located in a lower position than an edge region. The upper surface of the lower plate 410b and the lower surface of the upper plate 410a are combined with each other to form the buffer space 414. The buffer space 414 is provided as a space in which the gas supplied through the gas supply holes 412 temporarily stays before supplied into the chamber 100. The lower plate 410b has gas supply holes 413 formed in the central region thereof. The gas supply holes 413 are spaced apart from each other at predetermined intervals. The gas supply holes 413 are connected with the buffer space 414.

The distribution plate 420 is located under the lower plate 410b. The distribution plate 420 has a circular plate shape. The distribution plate 420 has distribution holes 421 formed therein. The distribution holes 421 extend from an upper surface of the distribution plate 420 to a lower surface thereof. As many distribution holes 421 as the gas supply holes 413 are provided. The distribution holes 421 are located to correspond to the points where the gas supply holes 413 are located. The process gas staying in the buffer space 414 is uniformly supplied into the chamber 100 through the gas supply holes 413 and the distribution holes 421.

The upper power supply 440 applies RF power to the upper plate 410a. The upper power supply 440 includes the upper RF power supply 441 and a matching circuit 442.

The heating unit 500 heats the lower plate 410b. The heating unit 500 includes a heater 510, a second upper power supply 520, and a filter 530. The heater 510 is installed in the lower plate 410b. The heater 510 may be provided in the edge region of the lower plate 410b. The heater 510 may include a heating coil. The heater 510 may be provided to surround the central region of the lower plate 410b. The second upper power supply 520 is electrically connected with the heater 510. The second upper power supply 520 may generate DC power. Alternatively, the second upper power supply 520 may generate AC power. Power with a second frequency that is generated by the second upper power supply 520 is applied to the heater 510, and the heater 510 generates heat by resisting the applied current. The heat generated from the heater 510 heats the lower plate 410b, and the heated lower plate 410b heats the distribution plate 420, which is located under the lower plate 410b, to a predetermined temperature. The lower plate 420 may be heated to a temperature of 60° C. to 300° C. Between the second upper power supply 520 and the heater 510, the filter 530 is electrically connected with the second upper power supply 520 and the heater 510.

Figure 2:
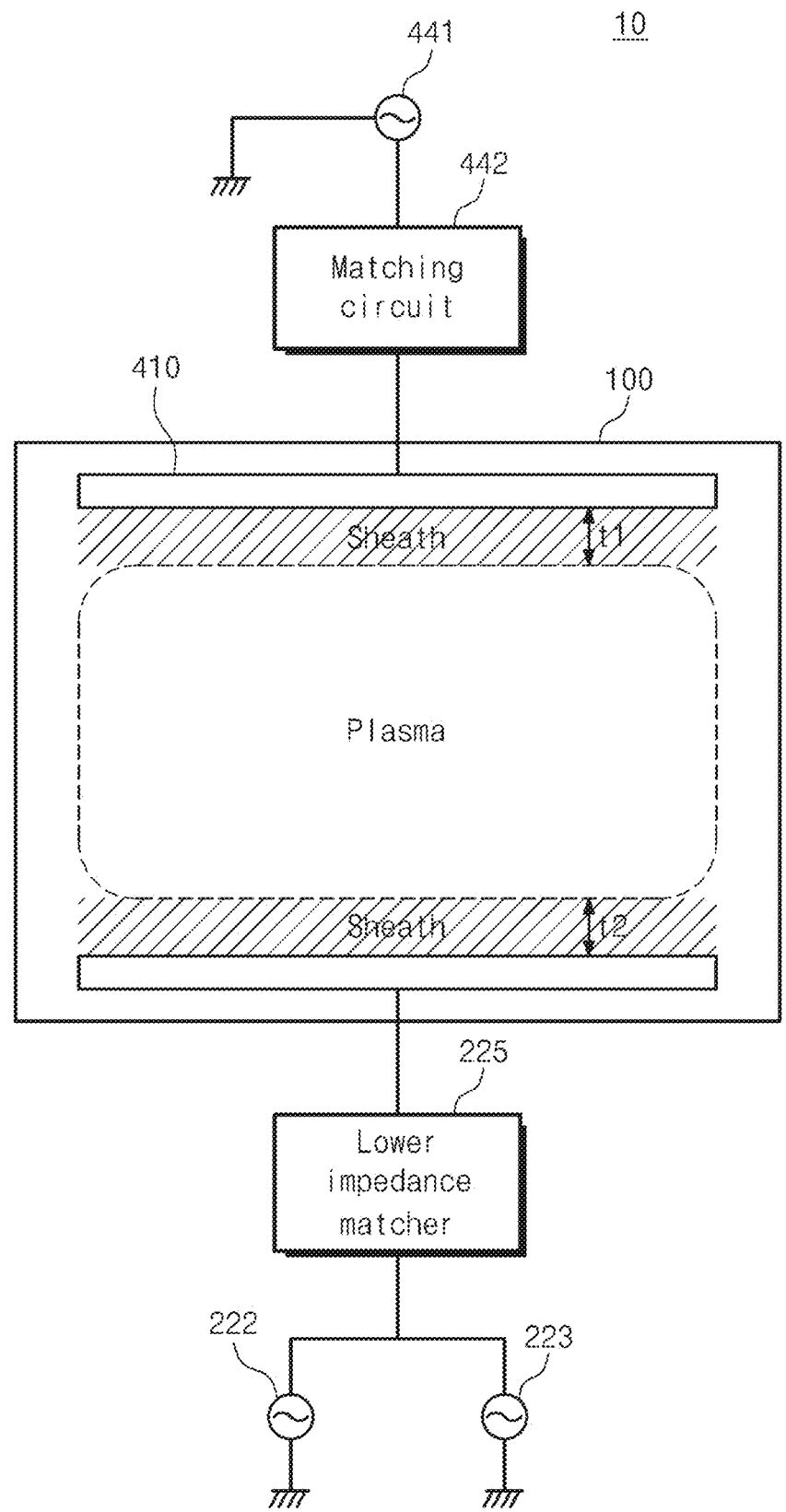
FIG. 2 is an exemplary view illustrating a configuration of a plasma generation unit according to an embodiment of the inventive concept.

FIG. 2 is a schematic view illustrating a configuration of the plasma generation unit 400 used in the substrate treating apparatus 10 according to an embodiment of the inventive concept.

Referring to FIG. 2, the plasma generation unit 400 according to the embodiment of the inventive concept includes the upper RF power supply 441, the upper electrode 410, the lower electrode 220, and the lower RF power supplies 222 and 223. In addition, the plasma generation unit 400 may include the matching circuit 442 connected to the upper RF power supply 441 and the lower impedance matcher 225 connected to the lower RF power supplies 222 and 223.

The upper RF power supply 441 may supply the first RF power, and the upper electrode 410 may receive the first RF power and may generate plasma. The lower electrode 220 may be disposed to be opposite the upper electrode 410. The lower RF power supplies 222 and 223 may be connected to the lower electrode 220. The lower RF power supplies 222 and 223 may supply the second RF power to allow ion particles contained in the plasma to move to the lower electrode 220.

A matching circuit in an existing plasma generation unit includes only a circuit that performs impedance matching between an RF power supply and a chamber, and a means for removing harmonics caused by the RF power supply does not exist. In general, the harmonics caused by the RF power supply are characterized in that the levels of the harmonics are significantly decreased after the third harmonic. Accordingly, a harmonic removal circuit for a source with second and third frequencies of 100 MHz or more is required.

Hereinafter, a substrate treating apparatus including a circuit capable of removing harmonics according to the inventive concept is disclosed.

Figure 3:
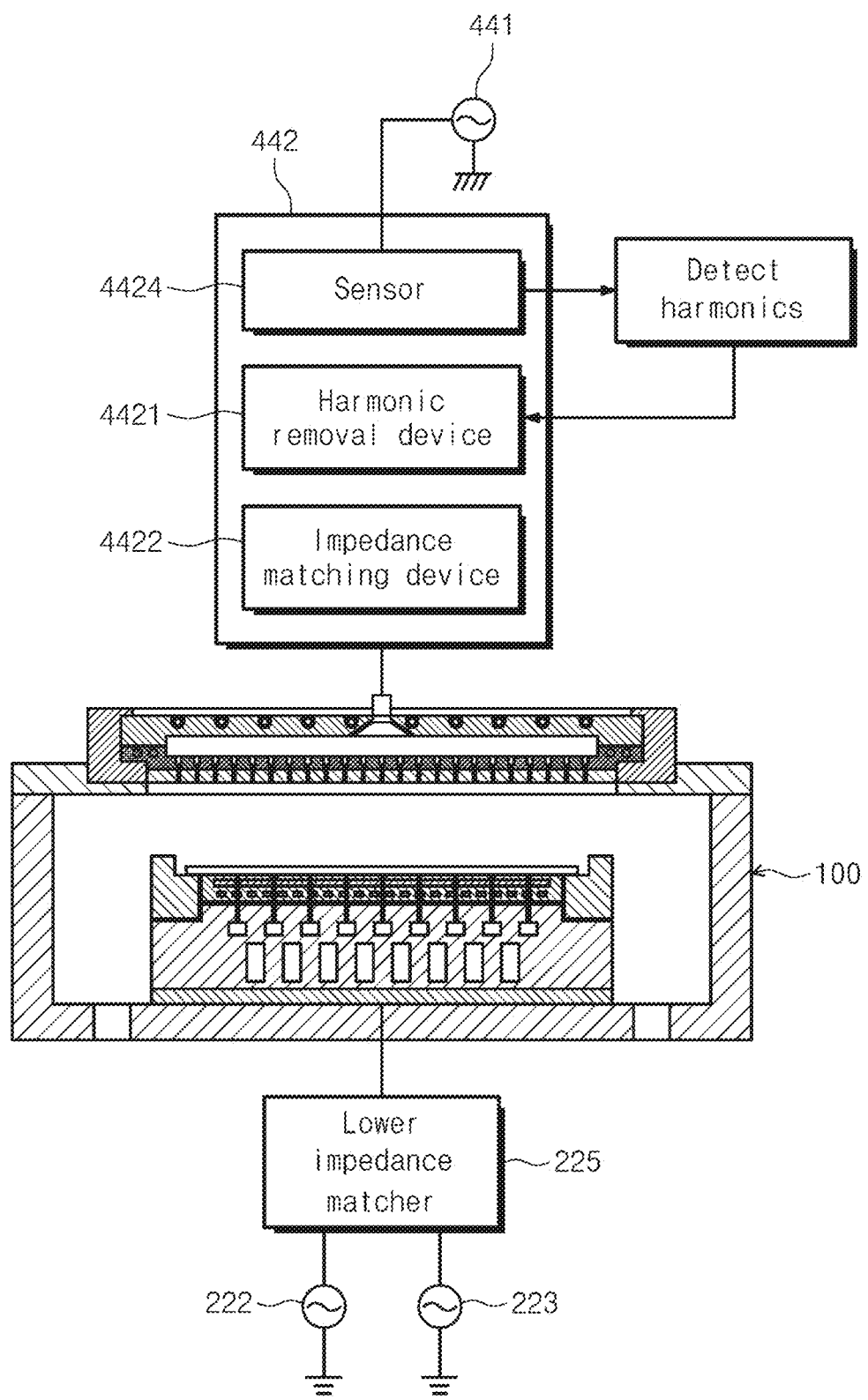
FIG. 3 is a schematic view including a block diagram illustrating a configuration of a plasma generation unit according to an embodiment of the inventive concept.

FIG. 3 is a schematic view including a block diagram illustrating a configuration of a plasma generation unit according to an embodiment of the inventive concept.

According to one feature of FIG. 3, a difference from FIG. 2 corresponds to one configuration of the matching circuit 442.

The matching circuit 442 according to the inventive concept may include a harmonic removal device 4421 and an impedance matching device 4422. The impedance matching device 4422 may perform impedance matching between the upper RF power supply 441 and the chamber 100. A configuration of a circuit of the impedance matching device 4422 may be diversely derived at the level of knowledge of a person skilled in the art. According to an embodiment, the impedance matching device 4422 may include a variable capacitor and a variable inductor.

Referring to FIG. 3, the matching circuit 442 according to the inventive concept may include the harmonic removal device 4421. The matching circuit 442 according to the inventive concept may include a sensor 4424. The sensor 4424 included in the matching circuit 442 may sense harmonics caused by the upper RF power supply 441. The sensor 4424 included in the matching circuit 442 may be connected with the upper RF power supply 441 and may sense the harmonics. When sensing the harmonics, the sensor 4424 may transfer signals corresponding to the harmonics to the harmonic removal device 4421. The sensed harmonics may vary depending on the frequency in the upper RF power supply 441. The frequencies of the harmonics sensed by the sensor 4424 may be set in advance. The sensor 4424 included in the matching circuit 442 serves to detect whether the harmonics caused by the upper RF power supply 441 are generated. When an outcome of the detection through the sensor 4424 shows that the harmonics are generated, the matching circuit 442 may perform control such that the harmonic removal device 4421 removes the harmonics.

The sensor 4424 included in the matching circuit 442 may be a VI sensor. The sensor 4424 may sense harmonics generated when RF power generated from the upper RF power supply 441 is applied to the chamber 100. The sensor 4424 may be connected to one end of the matching circuit 442 and may sense harmonics that are output in a direction toward the chamber 100.

The harmonic removal device 4421 may operate in a first mode or a second mode. In the harmonic removal device 4421, a circuit configuration connected may be changed depending on the first mode or the second mode. The harmonic removal device 4421 may include a harmonic removal line 4421b and a bypass line 4421a. A specific embodiment of the harmonic removal device 4421 will be described below with reference to FIG. 4.

A controller (not illustrated) may be included in the matching circuit 442. The controller may be connected with the sensor 4424. When the harmonics caused by the upper RF power supply 441 are sensed, the controller may allow the harmonic removal device 4421 to operate in the first mode or the second mode.

Figure 4:
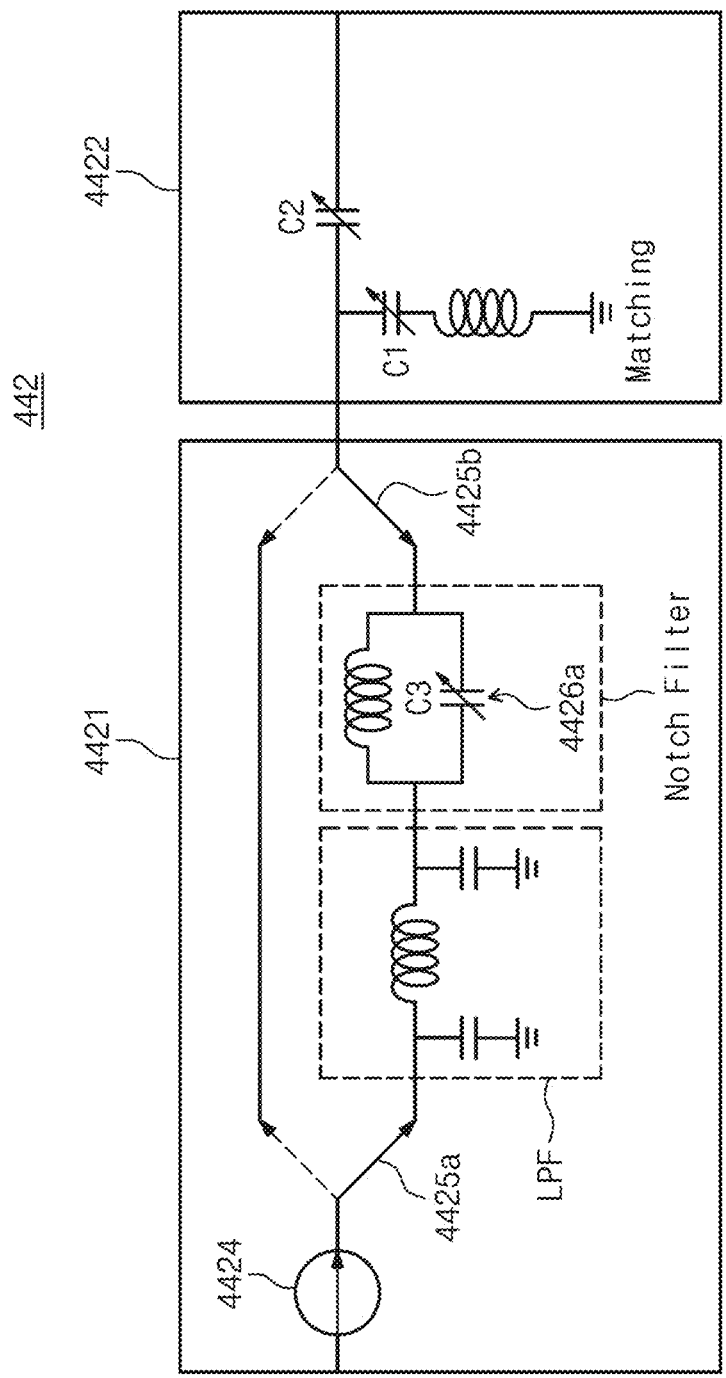
FIG. 4 is a view illustrating one embodiment of a matching circuit of FIG. 3.

FIG. 4 is a view illustrating one embodiment of the matching circuit 442 of FIG. 3.

The matching circuit 442 of FIG. 4 may include the harmonic removal device 4421 and the impedance matching device 4422. The impedance matching device 4422 may perform impedance matching between the upper RF power supply 441 and the chamber 100. According to an embodiment, the impedance matching device 4422 may include a variable capacitor and a variable inductor.

The harmonic removal device 4421 may include the bypass line 4421a and the harmonic removal line 4421b. The bypass line 4421a and the harmonic removal line 4421b may be connected with each other in parallel.

The harmonic removal line 4421b may include a low-pass filter (LPF) and a notch filter. The low-pass filter may serve to remove high frequency, and the notch filter may serve to control the level of a specific harmonic. According to an embodiment, a first variable capacitor 4426a may be included in the notch filter, and a specific harmonic sensed may be removed by controlling the first variable capacitor 4426a.

The harmonic removal line 4421b may be provided to remove second or higher harmonics caused by the upper RF power supply 441.

Switches may be connected to opposite ends of the harmonic removal device 4421. A switch to the bypass line 4421a or the harmonic removal line 4421b may be performed by switching the switches included in the harmonic removal device 4421. A first switch 4425a and a second switch 4425b may be included in the harmonic removal device 4421.

The first switch 4425a may connect one end of the harmonic removal device 4421 and one end of the bypass line 4421a, or the one end of the harmonic removal device 4421 and one end of the harmonic removal line 4421b.

The first switch 4425a may connect the one end of the harmonic removal device 4421 and the one end of the bypass line 4421a, or the one end of the harmonic removal device 4421 and one end of the low-pass filter.

The second switch 4425b may connect an opposite end of the harmonic removal device 4421 and an opposite end of the bypass line 4421a, or the opposite end of the harmonic removal device 4421 and an opposite end of the harmonic removal line 4421b.

The second switch 4425b may connect the opposite end of the harmonic removal device 4421 and the opposite end of the bypass line 4421a, or the opposite end of the harmonic removal device 4421 and an opposite end of the notch filter.

A transition of the matching circuit 442 to the first mode or the second mode may be achieved by switching the switches 4425a and 4425b included in the harmonic removal device 4421. Whether to switch the switches 4425a and 4425b included in the harmonic removal device 4421 may vary depending on whether harmonics are sensed.

The low-pass filter and the notch filter included in the harmonic removal line 4421b illustrated in FIG. 4 are provided as one example. A combination of the inductors and the capacitors included in the harmonic removal line 4421b may be differently applied to the extent to which a person skilled in the art can carry out a design change.

Figure 5A:
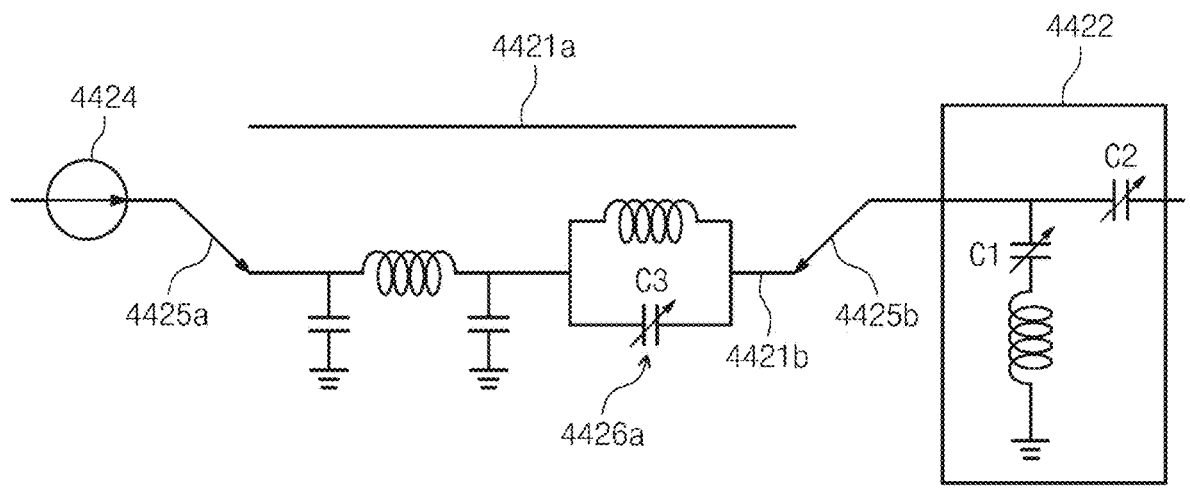
FIG. 5A illustrates a first mode of the matching circuit of FIG. 4.
Figure 5B:
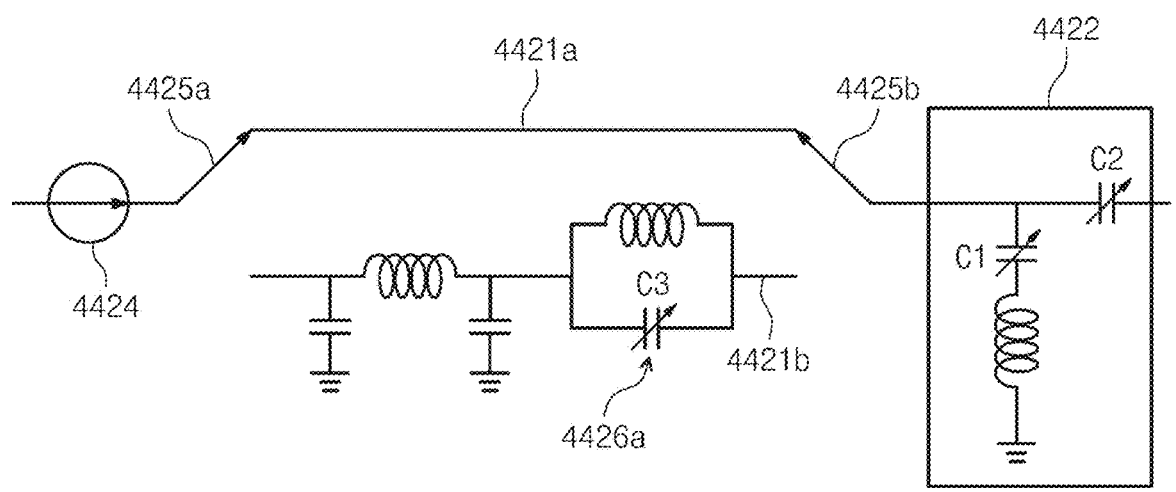
FIG. 5B illustrates a second mode of the matching circuit of FIG. 4.

FIG. 5A illustrates the first mode of the matching circuit 442 of FIG. 4, and FIG. 5B illustrates the second mode of the matching circuit 442 of FIG. 4.

The first mode refers to a mode in which the matching circuit 442 is formed such that a circuit capable of removing harmonics is included. The second mode refers to a mode in which the matching circuit 442 is formed such that the circuit capable of removing harmonics is not included.

FIG. 5A illustrates one example of the first mode of the matching circuit 442. The first switch 4425a is connected to the one end of the low-pass filter, and the second switch 4425b is connected to the opposite end of the notch filter. Through the connection of the switches 4425a and 4425b, connection to the harmonic removal line 4421b may be made, and the matching circuit 442 may remove sensed harmonics.

FIG. 5B illustrates one example of the second mode of the matching circuit 442. The first switch 4425a is connected to the one end of the bypass line 4421a, and the second switch 4425b is connected to the opposite end of the bypass line 4421a. Through the connection of the switches 4425a and 4425b, connection to the bypass line 4421a may be made, and the matching circuit 442 may perform only impedance matching.

In a case where harmonics are not sensed, a center-peak phenomenon does not occur, and therefore the harmonic removal circuit does not need to be used. In the case where harmonics are not sensed, the harmonic removal device 4421 may operate in the second mode, thereby preventing unnecessary RF power loss and eliminating side effects caused by circuit complexity.

As described above, a transition to the first mode or the second mode may be performed by switching the switches 4425a and 4425b included in the harmonic removal device 4421.

Figure 6:
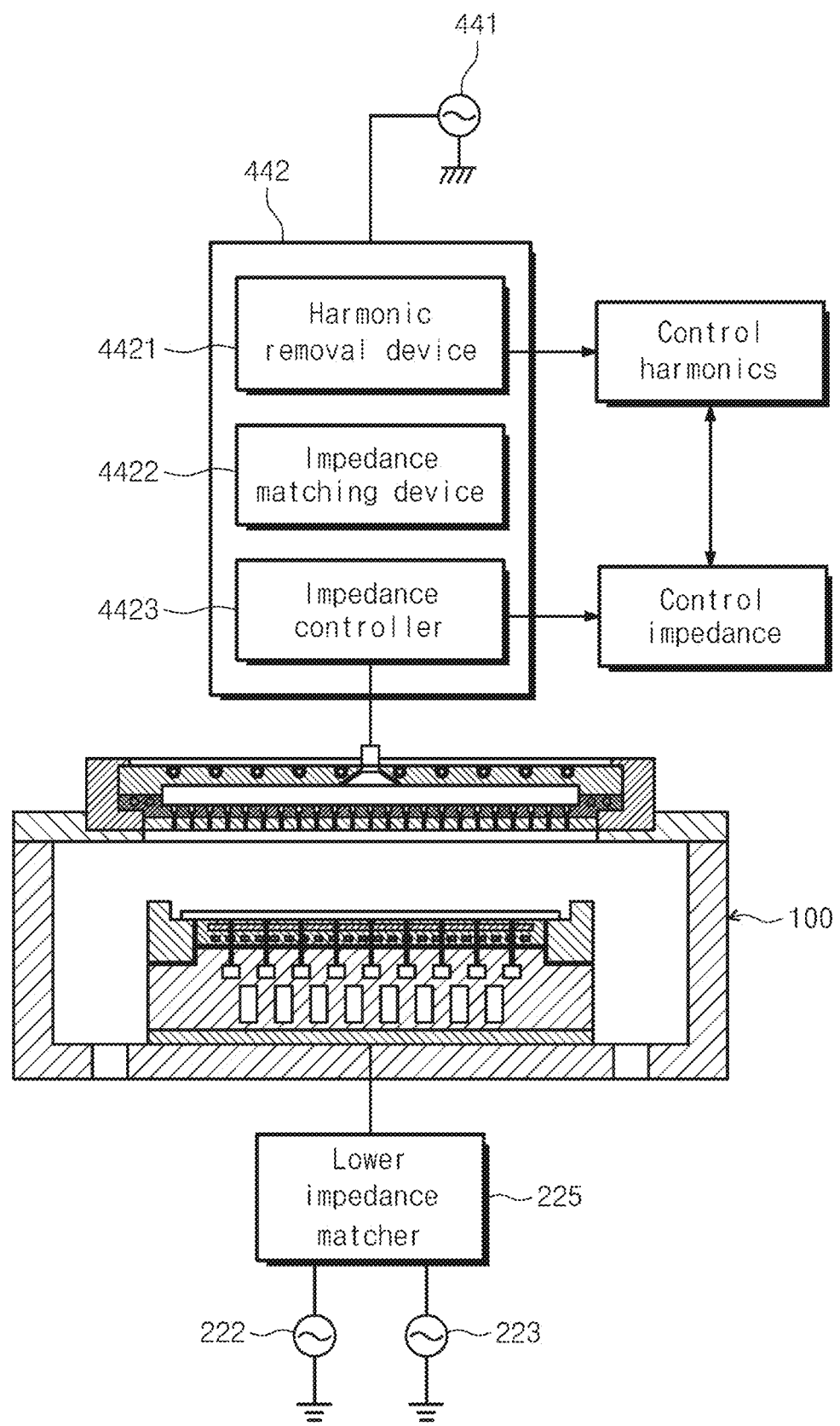
FIG. 6 is a schematic view including a block diagram illustrating a configuration of a plasma generation unit according to another embodiment of the inventive concept.

FIG. 6 is a schematic view including a block diagram illustrating a configuration of a plasma generation unit according to another embodiment of the inventive concept.

Referring to FIG. 6, a matching circuit 442 according to another embodiment of the inventive concept may further include an impedance controller 4423.

The matching circuit 442 according to the other embodiment of the inventive concept may include a harmonic removal device 4421, an impedance matching device 4422, and the impedance controller 4423. The harmonic removal device 4421 may remove harmonics caused by the upper RF power supply 441. The impedance matching device 4422 may perform impedance matching between the upper RF power supply 441 and the chamber 100. The impedance controller 4423 may remove harmonics caused by non-linearity of plasma in the chamber 100.

Although harmonics are generated from the upper RF power supply 441, harmonics are generated even in the chamber 100 due to non-linearity of a plasma sheath area.

In the other embodiment of the inventive concept, the matching circuit 442 may further include the impedance controller 4423 for controlling other harmonics generated in the plasma sheath area other than the harmonics generated from the upper RF power supply 441. The impedance controller 4423 may include a variable capacitor. The impedance controller 4423 may control the variable capacitor to remove harmonics or perform additional impedance control. Furthermore, the impedance controller 4423 may control impedance of the harmonics generated from the chamber 100.

Although not illustrated in FIG. 6, a sensor 4424 for sensing harmonics may be included in the matching circuit 442. According to an embodiment, a plurality of sensors 4424 may be included to sense set harmonics, respectively. The sensors 4424 may include a first sensor for sensing harmonics generated from the upper RF power supply 441 and a second sensor for sensing harmonics generated from the chamber 100.

In a case where harmonics are sensed through the first sensor 4424 and the second sensor 4424, the matching circuit 442 may operate in a first mode in which the harmonics are able to be removed, and in a case where harmonics are not sensed, the matching circuit 442 may operate in a second mode.

The first sensor 4424 and the second sensor 4424 may be connected to one end of the matching circuit 442. The matching circuit 442 may detect, through the first sensor 4424, the harmonics generated from the upper RF power supply 441 and may feed the detected harmonics back to the harmonic removal device 4421 to remove the harmonics generated from the upper RF power supply 441. The second sensor 4424 may sense a signal output from the chamber 100 after RF power is applied and plasma is formed in the chamber 100, thereby sensing the harmonics generated from the chamber 100.

Figure 7:
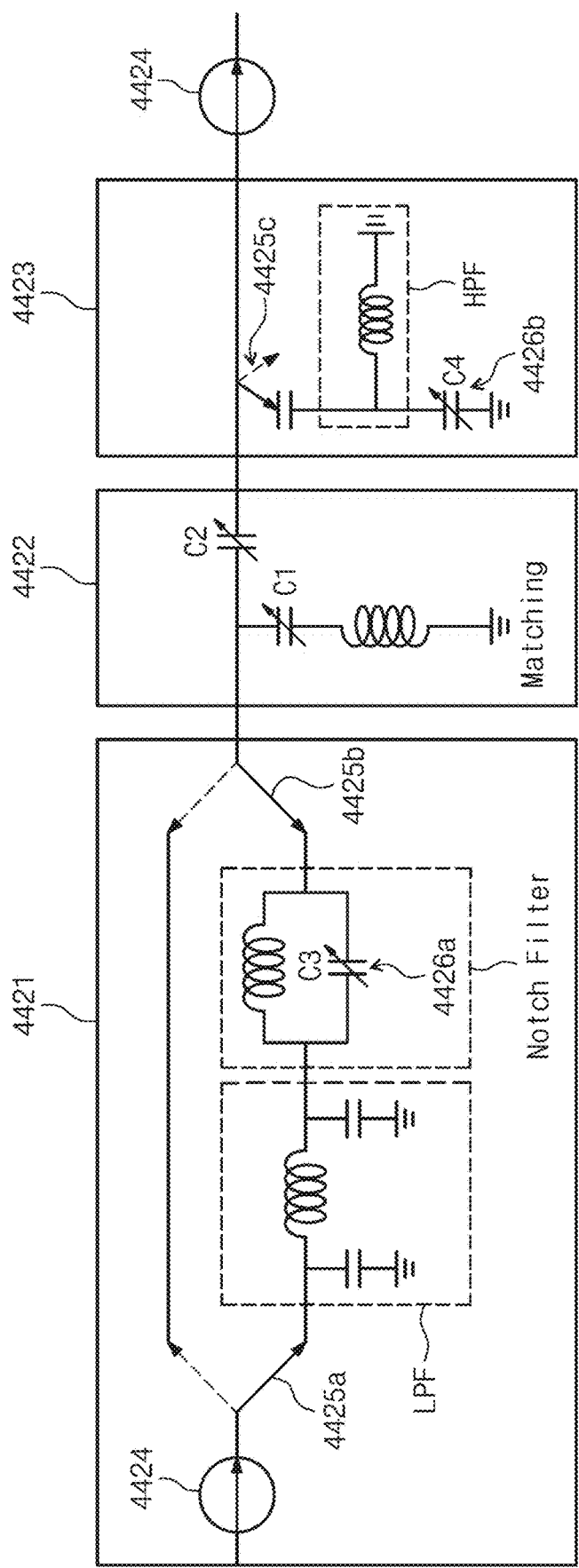
FIG. 7 is a view illustrating one embodiment of a matching circuit of FIG. 6.

FIG. 7 is a view illustrating one embodiment of the matching circuit 442 of FIG. 6.

Referring to FIG. 7, the matching circuit 442 may include the harmonic removal device 4421, the impedance matching device 4422, and the impedance controller 4423.

Configurations of the harmonic removal device 4421 and the impedance matching device 4422 are the same as those of the harmonic removal device 4421 and the impedance matching device 4422 described above with reference to FIG. 4. Therefore, descriptions thereabout will be omitted.

According to an embodiment, the impedance controller 4423 may include a high-pass filter (HPF) and a second variable capacitor 4426b. The high-pass filter (HPF) and the second variable capacitor 4426b may be connected in series. One end of the second variable capacitor 4426b may be connected to a ground.

The impedance controller 4423 may remove harmonics caused by non-linearity of plasma in the chamber 100. The impedance controller 4423 may include the second variable capacitor 4426b and may remove additionally generated harmonics. Alternatively, the impedance controller 423 may additionally match impedance generated due to the additional harmonics in addition to the removal of the harmonics. The impedance controller 4423 may adjust, through the second variable capacitor 4426b, impedance for the harmonics caused by the non-linearity of the plasma.

The impedance controller 4423 may further include a third switch 4425c connected to one end of the high-pass filter. Whether the impedance controller 4423 is connected to the matching circuit 442 may be determined depending on whether the third switch 4425 is turned on/off.

The substrate treating apparatus of the inventive concept may remove harmonics by adjusting a first variable capacitor 4426a included in the harmonic removal device 4421 and the second variable capacitor 4426b included in the impedance controller 4423.

The adjustment of the first variable capacitor 4426a may be performed before the adjustment of the second variable capacitor 4426b. The adjustment of the first variable capacitor 4426*a* and the adjustment of the second variable capacitor 4426*b* may affect each other. The first variable capacitor 4426*a* and the second variable capacitor 4426*b* may complement each other to adjust values. Harmonics caused by the upper RF power supply 441 may be removed through the adjustment of the first variable capacitor 4426*a*, and harmonics caused by nonlinearity of plasma generated in the chamber 100 may be removed by controlling impedance of the harmonics through the second variable capacitor 4426*b*.

Figure 8A:
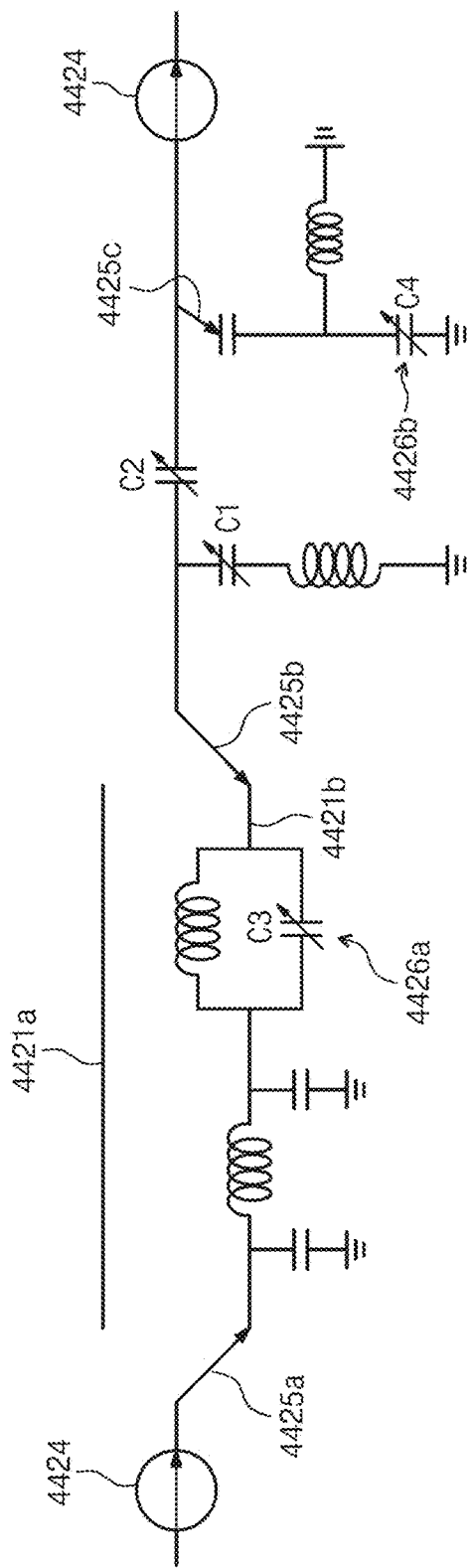
FIG. 8A illustrates a first mode of the matching circuit of FIG. 7.
Figure 8B:
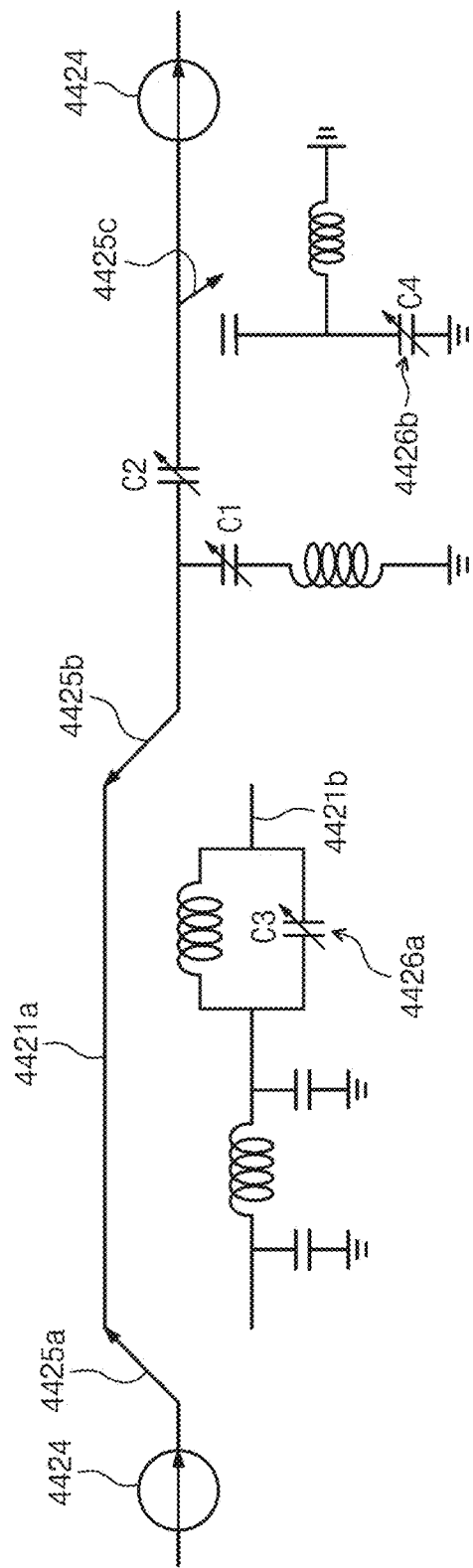
FIG. 8B illustrates a second mode of the matching circuit of FIG. 7.

FIG. 8A illustrates the first mode of the matching circuit 442 of FIG. 7, and FIG. 8B illustrates the second mode of the matching circuit 442 of FIG. 7.

The first mode refers to a mode in which the matching circuit 442 is formed to remove harmonics. The second mode refers to a mode in which the matching circuit 442 is formed so as not to remove harmonics.

FIG. 8A illustrates the first mode of the matching circuit 442. A first switch 4425*a* is connected to one end of a low-pass filter, and a second switch 4425*b* is connected to an opposite end of a notch filter. Through the connection of the switches 4425*a* and 4425*b*, connection to a harmonic removal line 4421*b* may be made, and the matching circuit 442 may remove sensed harmonics. Furthermore, the third switch 4425*c* may be connected with the high-pass filter, and the harmonics may be easily removed through the two variable capacitors 4426*a* and 4426*b* included in the matching circuit 442.

FIG. 8B illustrates the second mode of the matching circuit 442. The first switch 4425*a* is connected to one end of the bypass line 4421*a*, and the second switch 4425*b* is connected to an opposite end of the bypass line 4421*a*. Through the connection of the switches 4425*a* and 4425*b*, connection to the bypass line 4421*a* may be made. Furthermore, the third switch 4425*c* may be opened so as not to be connected with the high-pass filter, and therefore the second mode may be configured such that the matching circuit 442 performs only impedance matching.

As described above, the transition to the first mode or the second mode may be performed by adjusting the first switch 4425*a*, the second switch 4425*b*, and the third switch 4425*c*.

The reason why the second mode is added is because in the case where the harmonic removal device 4421 is included in the matching circuit 442, the additional passive elements cause side effects and increase power consumption, and it is inefficient to operate the harmonic removal device 4421 even when harmonics are not sensed. Accordingly, in the inventive concept, depending on whether harmonics are sensed or not, the matching circuit 442 may transition to the first mode or the second mode, and thus an effect of more efficiently configuring the circuit may be obtained.

Figure 9:
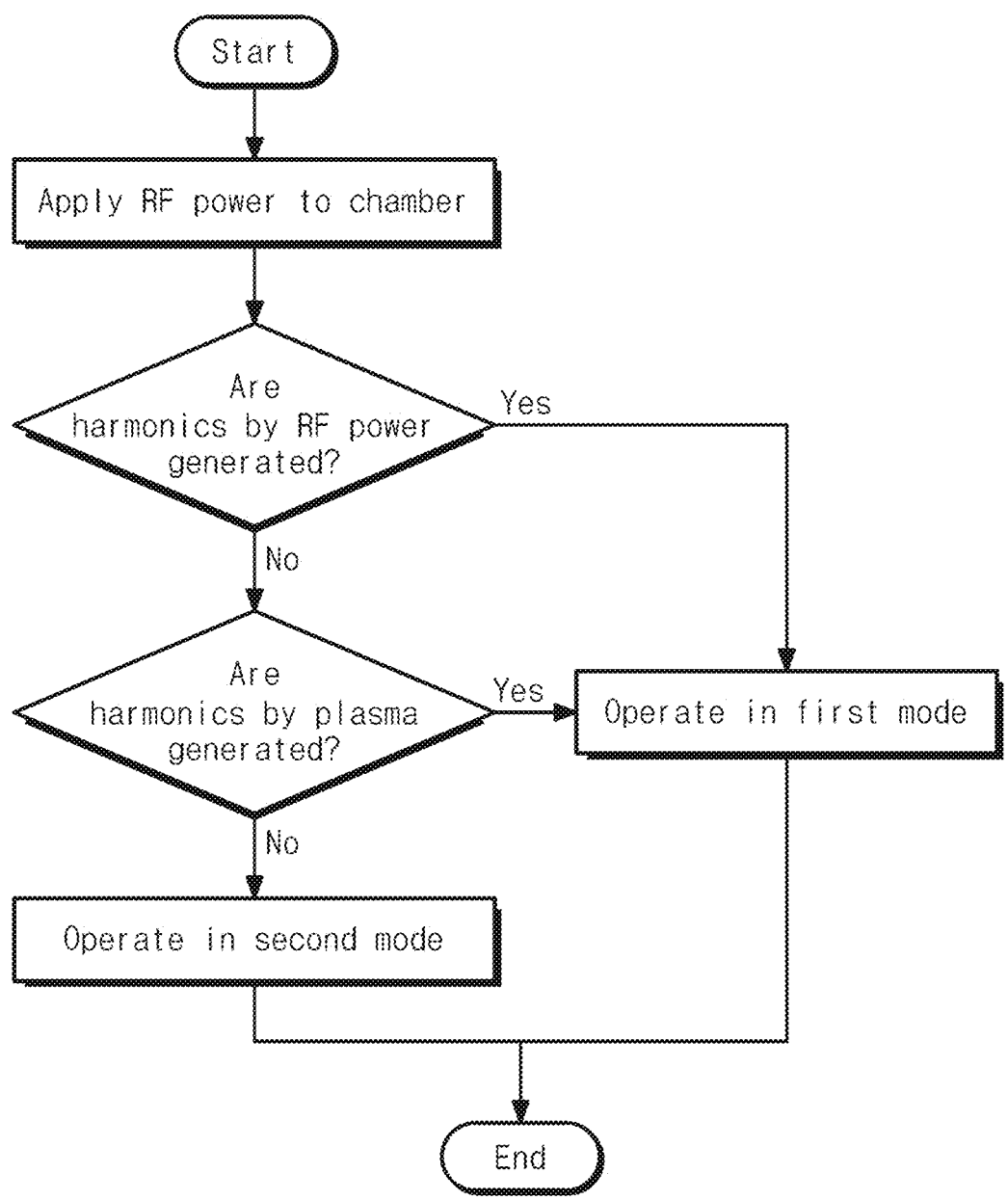
FIG. 9 is a flowchart illustrating a substrate treating method according to an embodiment of the inventive concept.

FIG. 9 is a flowchart illustrating a substrate treating method according to an embodiment of the inventive concept.

Referring to FIG. 9, RF power is applied to the chamber 100 included in the substrate treating apparatus 10 through the upper RF power supply 441. Accordingly, plasma may be generated. Whether harmonics are generated from the upper RF power supply 441 is determined by using the sensor 4424 connected between the upper RF power supply 441 and the chamber 100. Alternatively, whether harmonics are caused by non-linearity of the plasma generated in the chamber 100 is determined. When it is determined in the two processes that harmonics are not generated, the matching circuit 442 may be controlled to operate in the second mode. When it is determined in the two processes that harmonics are generated, or when it is determined in one of the two processes that harmonics are generated, the matching circuit 442 may be controlled to operate in the first mode. The matching circuit 442 may be controlled by the controller included in the substrate treating apparatus 10. A transition to the first mode or the second mode may be performed by controlling the switches included in the matching circuit 442. Accordingly, a substrate may be appropriately treated depending on whether harmonics are sensed or not.

Although the above description has been given based on the matching circuit 442 connected to the upper RF power supply 441, the inventive concept may be applied to the matching circuit 442 connected to the lower RF power supplies 222 and 223.

As described above, according to the embodiments of the inventive concept, the substrate treating apparatus and method may remove harmonics generated when RF power is applied.

Furthermore, the substrate treating apparatus and method may remove harmonics caused by non-linearity of plasma in a chamber.

Moreover, the substrate treating apparatus and method may improve a center-peak phenomenon caused by harmonics and may improve and optimize plasma uniformity between a central portion and an edge portion in a chamber.

In addition, the substrate treating apparatus and method may change a mode of a matching circuit depending on whether harmonics are sensed or not, thereby reducing unnecessary RF power loss and eliminating side effects due to an increase in circuit complexity.

Effects of the inventive concept are not limited to the aforementioned effects, and any other effects not mentioned herein may be clearly understood from this specification and the accompanying drawings by those skilled in the art to which the inventive concept pertains.

Although the embodiments of the inventive concept have been described above, it should be understood that the embodiments are provided to help with comprehension of the inventive concept and are not intended to limit the scope of the inventive concept and that various modifications and equivalent embodiments can be made without departing from the spirit and scope of the inventive concept. The drawings provided in the inventive concept are only drawings of the optimal embodiments of the inventive concept. The scope of the inventive concept should be determined by the technical idea of the claims, and it should be understood that the scope of the inventive concept is not limited to the literal description of the claims, but actually extends to the category of equivalents of technical value.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
a process chamber having a treatment space therein;
a support unit configured to support the substrate in the treatment space;
a gas supply unit configured to supply a process gas into the treatment space;
an RF power supply configured to supply an RF signal to excite the process gas into plasma; and
a matching circuit connected between the RF power supply and the process chamber, wherein the matching circuit includes,
an impedance matching device configured to perform impedance matching,, and
a harmonic removal device configured to remove harmonics caused by the RF power supply, the harmonic removal device including a low-pass filter and a notch filter that are connected in series between the RF power supply and the impedance matching device.

2. The apparatus of claim 1, wherein the matching circuit is configured to:
operate in a first mode when the harmonics caused by the RF power supply are sensed; and
operate in a second mode when the harmonics caused by the RF power supply are not sensed.

3. An apparatus for treating a substrate, the apparatus comprising:
a process chamber having a treatment space therein;
a support unit configured to support the substrate in the treatment space;
a gas supply unit configured to supply a process gas into the treatment space;
an RF power supply configured to supply an RF signal to excite the process gas into plasma; and
a matching circuit connected between the RF power supply and the process chamber,
wherein the matching circuit includes a harmonic removal device and an impedance matching device between the RF power supply and the process chamber, and
wherein the apparatus further comprises a switch for connecting the harmonic removal device to the RF power supply.

4. The apparatus of claim 3, wherein
the harmonic removal device includes,
a harmonic removal line including a first variable capacitor configured to remove harmonics, and
a bypass line connected with the harmonic removal line in parallel, and
the switch is configured to selectively connect one of the harmonic removal line and the bypass line that are between the RF power supply and the impedance matching device.

5. The apparatus of claim 4, wherein the switch includes:
a first switch configured to switch between one end of the bypass line and one end of the harmonic removal line; and
a second switch configured to switch between an opposite end of the bypass line and an opposite end of the harmonic removal line.

6. The apparatus of claim 3, wherein
the harmonic removal device includes,
a harmonic removal line including a low-pass filter and a notch filter that are connected in series between the RF power supply and the impedance matching device, and
a bypass line connected with the harmonic removal line in parallel, and
the switch is configured to selectively connect to one of the harmonic removal line and the bypass line that are between the RF power supply and the impedance matching device.

7. The apparatus of claim 4, wherein the matching circuit further includes:
a sensor configured to sense the harmonics caused by the RF power supply.

8. The apparatus of claim 7, wherein the switch is configured to connect the harmonic removal line between the RF power supply and the impedance matching device when the sensor senses the harmonics.

9. An apparatus for treating a substrate, the apparatus comprising:
a process chamber having a treatment space therein;
a support unit configured to support the substrate in the treatment space;
a gas supply unit configured to supply a process gas into the treatment space;
an RF power supply configured to supply an RF signal to excite the process gas into plasma; and
a matching circuit connected between the RF power supply and the process chamber,
wherein the matching circuit includes,
an impedance matching device configured to perform impedance matching,
a harmonic removal device configured to remove harmonics caused by the RF power supply, the harmonic removal device including a low-pass filter and a notch filter that are connected in series between the RF power supply and the impedance matching device, and
an impedance controller configured to remove harmonics caused by non-linearity of the plasma in the process chamber.

10. The apparatus of claim 9, wherein the matching circuit is configured to:
operate in a first mode when the harmonics caused by the RF power supply or the harmonics caused by the non-linearity of the plasma in the process chamber are sensed; and
operate in a second mode when the harmonics caused by the RF power supply or the harmonics caused by the non-linearity of the plasma in the process chamber are not sensed.

11. An apparatus for treating a substrate, the apparatus comprising:
a process chamber having a treatment space therein;
a support unit configured to support the substrate in the treatment space;
a gas supply unit configured to supply a process gas into the treatment space;
an RF power supply configured to supply an RF signal to excite the process gas into plasma; and
a matching circuit connected between the RF power supply and the process chamber,
wherein the matching circuit includes,
an impedance matching device configured to perform impedance matching,
a harmonic removal device configured to remove harmonics caused by the RF power supply, and
an impedance controller configured to remove harmonics caused by non-linearity of the plasma in the process chamber,
wherein the matching circuit is configured to,
operate in a first mode when the harmonics caused by the RF power supply or the harmonics caused by the non-linearity of the plasma in the chamber are sensed, and
operate in a second mode when the harmonics caused by the RF power supply or the harmonics caused by the non-linearity of the plasma in the chamber are not sensed, and
wherein a transition to the first mode or the second mode is performed by switching switches connected to opposite ends of the harmonic removal device included in the matching circuit and a switch included in the impedance controller.

12. The apparatus of claim 11, wherein
the harmonic removal device includes,
  a harmonic removal line including a first variable capacitor configured to remove the harmonics, and
  a bypass line connected with the harmonic removal line in parallel, and
the impedance controller includes,
  a high-pass filter, and
  a second variable capacitor connected with the high-pass filter in series.

13. The apparatus of claim 12, wherein
the harmonic removal device further includes,
  a first switch configured to switch between one end of the bypass line and one end of the harmonic removal line, and
  a second switch configured to switch between an opposite end of the bypass line and an opposite end of the harmonic removal line, and
wherein the impedance controller further includes a third switch connected to one end of the high-pass filter.

14. The apparatus of claim 13, wherein the transition to the first mode or the second mode is performed by selective connection of the first switch, the second switch, and the third switch.

15. The apparatus of claim 12, wherein the matching circuit further includes:
  a sensor configured to sense the harmonics caused by the RF power supply and the harmonics caused by the non-linearity of the plasma in the process chamber.

16. The apparatus of claim 15, wherein the matching circuit is configured to remove the harmonics by adjusting the first variable capacitor included in the harmonic removal device and the second variable capacitor included in the impedance controller.

* * * * *